United States Patent
Taeger et al.

(10) Patent No.: US 9,570,662 B2
(45) Date of Patent: Feb. 14, 2017

(54) METHOD OF ENCAPSULATING AN OPTOELECTRONIC DEVICE AND LIGHT-EMITTING DIODE CHIP

(75) Inventors: Sebastian Taeger, Bad Abbach (DE); Michael Huber, Bad Abbach (DE); Martin Welzel, Dresden (DE); Karl Engl, Pentling (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/413,029

(22) PCT Filed: Jul. 10, 2012

(86) PCT No.: PCT/EP2012/063484
§ 371 (c)(1),
(2), (4) Date: Mar. 9, 2015

(87) PCT Pub. No.: WO2014/008927
PCT Pub. Date: Jan. 16, 2014

(65) Prior Publication Data
US 2016/0027972 A1    Jan. 28, 2016

(51) Int. Cl.
*H01L 21/00* (2006.01)
*H01L 33/54* (2010.01)
*H01L 33/44* (2010.01)
*H01L 33/56* (2010.01)

(52) U.S. Cl.
CPC .............. *H01L 33/54* (2013.01); *H01L 33/44* (2013.01); *H01L 33/56* (2013.01); *H01L 2933/005* (2013.01)

(58) Field of Classification Search
CPC .......... H01L 33/52; H01L 33/54; H01L 33/56; H01L 2933/005

USPC ......... 257/100, 787, 788, E33.059; 438/106, 438/127
See application file for complete search history.

(56) References Cited

U.S. PATENT DOCUMENTS

| 5,620,530 | A  | * | 4/1997  | Nakayama | H01L 31/0236 136/259 |
|-----------|----|---|---------|----------|----------------------|
| 8,633,585 | B2 | * | 1/2014  | Schmid   | C23C 16/0272 136/249 |
| 2006/0246811 | A1 | * | 11/2006 | Winters | H01L 51/5237 445/25 |
| 2008/0241421 | A1 |   | 10/2008 | Chen et al. | |
| 2009/0035946 | A1 |   | 2/2009  | Pierreux et al. | |
| 2010/0317132 | A1 | * | 12/2010 | Rogers | H01L 25/0753 438/27 |

(Continued)

FOREIGN PATENT DOCUMENTS

| EP | 2 398 044 A2 | 12/2011 |
| TW | 200841393 | 10/2008 |

OTHER PUBLICATIONS

English translation of a Chinese Notification of the First Office Action dated Jul. 6, 2016, from corresponding Chinese Application No. 201280074584.6.

*Primary Examiner* — Victor A Mandala
*Assistant Examiner* — Colleen E Snow
(74) *Attorney, Agent, or Firm* — DLA Piper LLP (US)

(57) ABSTRACT

A method of encapsulating an optoelectronic device includes providing a surface intended to be encapsulated, the surface containing platinum, generating reactive oxygen groups and/or reactive hydroxyl groups on the surface, and depositing a passivation layer by atomic layer deposition on the surface.

13 Claims, 2 Drawing Sheets

(56) References Cited

U.S. PATENT DOCUMENTS

| | | |
|---|---|---|
| 2011/0092005 A1 | 4/2011 | Horng et al. |
| 2012/0032355 A1 | 2/2012 | Wang et al. |
| 2012/0204935 A1* | 8/2012 | Meyer ................... F24J 2/16 136/246 |
| 2012/0228651 A1* | 9/2012 | Horng ................ H01L 25/0753 257/93 |
| 2012/0313131 A1* | 12/2012 | Oda .................... H01L 21/6835 257/98 |

* cited by examiner

METHOD OF ENCAPSULATING AN OPTOELECTRONIC DEVICE AND LIGHT-EMITTING DIODE CHIP

TECHNICAL FIELD

This disclosure relates to a method of encapsulating an optoelectronic device and a light-emitting diode chip.

BACKGROUND

There is a need to provide a method for an improved encapsulation of an optoelectronic device and a light-emitting diode chip having an improved encapsulation.

SUMMARY

We provide a method of encapsulating an optoelectronic device including providing a surface intended to be encapsulated, the surface containing platinum, generating reactive oxygen groups and/or reactive hydroxyl groups on the surface, and depositing a passivation layer by atomic layer deposition on the surface.

We also provide a light-emitting diode chip manufactured by the method of encapsulating an optoelectronic device including providing a surface intended to be encapsulated, the surface containing platinum, generating reactive oxygen groups and/or reactive hydroxyl groups on the surface, and depositing a passivation layer by atomic layer deposition on the surface.

DETAILED DESCRIPTION

Figure 1:
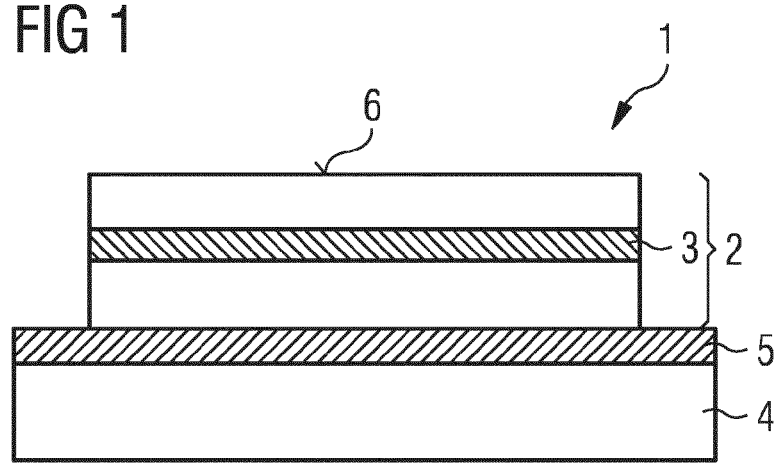
FIG. 1 shows a schematic cross-sectional view of a thin film light-emitting diode.

Our method of encapsulating an optoelectronic device has the following steps:
 providing a surface intended to be encapsulated,
 generating reactive oxygen groups and/or reactive hydroxyl groups on the surface, and
 depositing a passivation layer with the help of atomic layer deposition on the surface.

The reactive oxygen groups and/or reactive hydroxyl groups on the surface intended to be encapsulated, lead advantageously to an improved adhesion of the passivation layer subsequently deposited with atomic layer deposition.

To provide good encapsulating properties, the passivation layer is preferably hermetically tight for fluids, moisture and gasses such as water or air.

With the term "atomic layer deposition" (ALD-method) a specific chemical vapor deposition method (CVD-method) is designated. In general, during a CVD-method, the surface which is intended to be coated is provided in a volume. Further, there is at least one initial material provided in this volume, wherein the initial material forms a rigid layer on the surface by a chemical reaction. Mostly, there is at least one further initial material provided within the volume. The further initial material chemically reacts with the other initial material and forms a rigid layer on the surface. The CVD-method is therefore characterized by at least one chemical reaction to form the layer on the surface to be coated. Mostly, the surface intended to be coated is heated to a given temperature. Preferably, the surface is heated to the reaction temperature of the chemical reaction of the CVD-process.

During the ALD-method, a first initial material is fed in gaseous form in the volume in which the surface to be coated is provided. Then, the first initial material adsorbs on the surface. After the surface is coated, preferably completely with a layer of adsorbed first initial material, the non-adsorbed part of the initial material is removed from the volume. Then, a second initial material is fed in the volume. The second initial material is intended to chemically react with the adsorbed first initial material such that a rigid layer is formed on the surface.

With the method described herein it is in particular possible to very efficiently encapsulate a surface containing at least one of the following materials: platinum, gallium nitride, gallium phosphide, gallium arsenide, silicon oxide.

In particular, it is possible to efficiently encapsulate a surface at least partly containing platinum or is at least partly formed by platinum. Since platinum, as a noble metal, is very chemically inert, it is quite difficult to deposit a passivation layer in direct contact with platinum in a mechanically stable manner.

Furthermore, it is possible to encapsulate a surface with the passivation layer, wherein the surface contains different regions with different materials. For example, a part of the surface has a metallic character and contains, for example, platinum or is formed by platinum. Another part of the surface has, for example, a semiconducting character and contains, for example, gallium nitride, gallium phosphide or gallium arsenide or is formed by gallium nitride, gallium phosphide or gallium arsenide. Further, another part of the surface can have a dielectric character and contains, for example, silicon oxide or is formed by silicon oxide.

Preferably, the passivation layer is deposited in direct contact with the surface to be encapsulated to provide a tight encapsulation. Also preferably, the surface intended to be encapsulated is completely covered with the passivation layer.

Preferably, before the passivation layer is deposited on the surface, contaminations are also removed from the surface. For example, it is possible that contaminations from the surrounding media are arranged on the surface. The contaminations can be carbonate-based organic compounds, for example. Particularly preferably, removal of the contaminations from the surface is carried out simultaneously with generation of the reactive oxygen groups and/or reactive hydroxyl groups on the surface.

The reactive oxygen groups and/or reactive hydroxyl groups on the surface intended to be encapsulated are preferably generated by one of the following methods: treatment with an oxygen containing plasma or treatment with ozone.

The oxygen containing plasma can, for example, comprise one of the following materials or can be formed of one of the following materials: pure oxygen, nitrous oxide.

For example, treatment with ozone is rinsing the surface intended to be encapsulated with a gaseous ozone stream. These methods are in general also suited to remove contaminations from the surface.

The passivation layer particularly preferably comprises a semiconductor oxide or a metal oxide such as aluminium oxide or silicon oxide. Further, it is possible that the passivation layer consists of a semiconductor oxide or metal oxide such as aluminium oxide or silicon oxide.

Preferably, the thickness of the passivation layer is 15 nm to 50 nm.

According to a further example, a further dielectric layer is deposited on the passivation layer. Preferably, the dielectric layer is arranged in direct contact with the passivation layer.

The further dielectric layer is, for example, deposited with the help of one of the following methods: atomic layer deposition, chemical vapor deposition, plasma enhanced chemical vapor deposition, physical vapor deposition or sputtering.

During physical vapor deposition (PVD-method), the surface which is intended to be coated is provided in a volume. In this volume, an initial material is further provided which condenses directly on the surface and forms a rigid layer on the surface. In particular, the following methods are called PVD-method: thermal evaporation and sputtering.

Plasma enhanced chemical vapor deposition (PECVD-method) is, as is the ALD-method, a specific CVD-method. The PECVD-process is characterized in that plasma is discharged in the volume in which the surface intended to be coated is provided.

Preferably, the passivation layer functions as an adhesion enhancing layer with respect to the further dielectric layer. In other words, the passivation layer preferably has a good adhesion to the further dielectric layer.

For example, the dielectric layer has a passivating, isolating and/or optical function.

The further dielectric layer comprises, for example, one of the following materials: silicon oxide and silicon nitride.

The thickness of the further dielectric layer is preferably 100 nm to 500 nm.

For example, the surface intended to be encapsulated is part of an optoelectronic device such as a light-emitting diode chip.

A light-emitting diode chip comprises in general an active light-generating zone. The light-generating zone contains, for example, a pn-junction, a double hetero structure, a single quantum well or a multiple quantum well. Further, these quantum structures can be not only three-dimensional, but also two-dimensional or one-dimensional. The active zone is, in general, part of an epitaxially multilayer stack, which is epitaxially grown on a growth substrate.

For example, the active zone bases on a nitride semiconductor compound material. The term that the active zone "bases on a nitride semiconductor compound material" means that the plurality of epitaxially grown layers and, in particular, the active zone comprises at least one layer, which comprises the material $Al_nGa_mIn_{1-n-m}N$, wherein $0 \leq n \leq 1$, $0 \leq m \leq 1$ and $n+m \leq 1$ or consists of this material. For example, the active zone can comprise gallium nitride or can consist of gallium nitride.

Alternatively, the active zone bases on a phosphide semiconductor compound material. The term that the active zone "bases on a phosphide semiconductor compound material" means that the plurality of epitaxially grown layers and, in particular, the active zone comprises at least one layer comprising the material $Al_nGa_mIn_{1-n-m}P$, wherein $0 \leq n \leq 1$, $0 \leq m \leq 1$ and $n+m \leq 1$ or consists of this material. For example, the active zone can comprise gallium phosphide or can consist of gallium phosphide.

Further, it is also possible that the active zone bases on an arsenide semiconductor compound material. The term that the active zone "bases on an arsenide semiconductor compound material" means that the plurality of epitaxially grown layers and, in particular, the active zone comprises at least one layer comprising the material $Al_nGa_mIn_{1-n-m}As$, wherein $0 \leq n \leq 1$, $0 \leq m \leq 1$ and $n+m \leq 1$ or consists of this material. For example, the active zone can comprise gallium arsenide or can consist of gallium arsenide.

The light emitting diode chip can be a thin film light-emitting diode chip. A thin film diode chip is free of the growth substrate of the epitaxially multilayer stack or the growth substrate is thinned such that it can not stabilize the epitaxially grown multilayer stack sufficiently. To render the chip mechanically stabile, the thin film diode chip comprises a further carrier, which is different from the growth substrate.

The carrier is, for example, fixed to the epitaxially grown multilayer stack with the active zone by one of the following methods: gluing, bonding and soldering.

Particularly preferably, a reflective layer is arranged between the carrier and the epitaxially multilayer stack. The reflective layer redirects radiation of the active zone, which is emitted in the direction of the carrier, to the radiation-emitting front side of the light-emitting diode chip.

The reflective layer can be formed by a plurality of layers. For example, the reflective layer can be a Bragg-mirror. Further, the reflective layer can comprise a dielectric layer and/or a metallic layer.

In particular, a platinum surface can be part of the reflective layer. Also, a platinum surface can be part of an electrical contact of the light emitting diode chip.

Further preferred examples are described in the following in connection with the Figures.

With the help of the schematic FIGS. 1 to 5, an example of our methods and devices is described.

Equal or similar elements as well as elements of equal function are designated with the same reference signs in the figures. The figures and the proportions of the elements shown in the figures are not regarded as being shown to scale. Rather, single elements, in particular layers, can be shown exaggerated in magnitude for the sake of better presentation.

According to the method of FIGS. 1 to 5, a thin film light-emitting diode chip 1 is provided in a first step. FIG. 1 shows a schematic cross-sectional view of an thin film light-emitting diode 1. The thin film light-emitting diode chip 1 comprises an epitaxially grown multilayer stack 2 based on gallium nitride, gallium phosphide or gallium arsenide with a radiation-generating active zone 3. The epitaxially grown multilayer stack 2 is arranged on a carrier 4 which mechanically stabilizes the multilayer stack 2. The carrier 4 is different from the growth substrate, which was used for the epitaxial growth of the multilayer stack 2.

Between the multilayer stack 2 and the carrier 4 a reflective layer 5 is positioned. The reflective layer 5 is not necessarily a single layer. Moreover, the reflective layer 5 can contain a plurality of single layers, which might be metallic or dielectric. The surface of the reflective metallic layer 5 contains platinum at the present.

The surface 6 intended to be encapsulated is the platinum surface of the metallic reflective layer 5 and further the lateral faces and the light-emitting front side of the multilayer stack 2. Therefore, the surface 6 intended to be encapsulated comprises different regions with different materials. The parts of the surface 6 intended to be encapsulated and formed by the surface of the multilayer stack 2 are based on gallium nitride, gallium phosphide or gallium arsenide and the parts of the surface 6 formed by the surface of the metallic reflective 5 layer contain platinum. Further, it is also possible that the surface 6 intended to be encapsulated also comprises parts having a dielectric character. Such parts can be, for example, formed by a dielectric layer on the thin film light-emitting diode chip 1.

Figure 2:
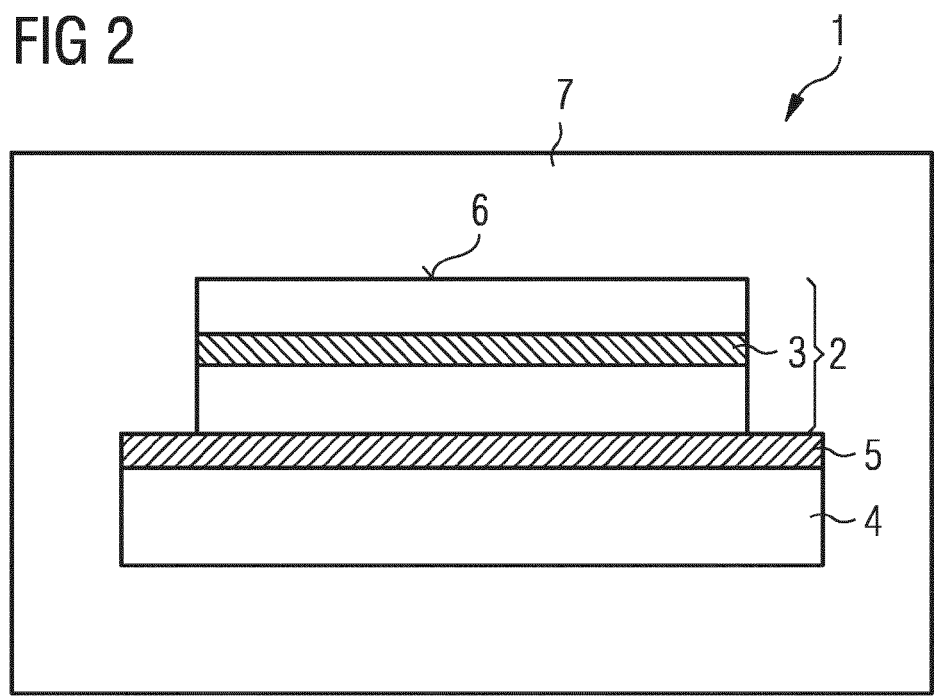
FIGS. 2-5 schematically show cross-sectional views of an example of a series of steps encapsulating a diode.

In a next step schematically shown in FIG. 2, the thin film light-emitting diode chip 1 of FIG. 1 is treated with oxygen containing plasma 7. Alternatively or additionally, the thin film light-emitting diode chip 1 can be treated with ozone, for example, by rinsing with a gaseous ozone stream.

The treatment of the thin film light-emitting diode chip 1 with the oxygen containing plasma 7 is carried out preferably between 15 seconds and 60 seconds, including the limits.

Figure 3:
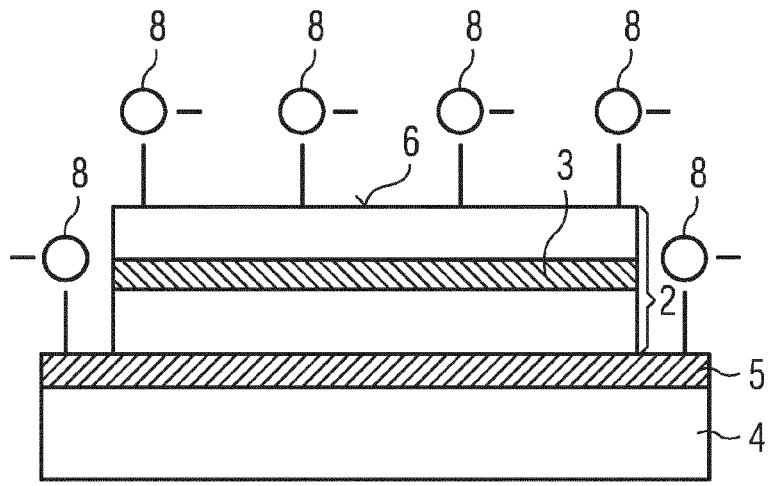

With the treatment of the oxygen containing plasma and/or with the rinsing with the gaseous ozone stream, reactive oxygen groups 8 are generated on the surface of the thin film light-emitting diode chip 1 and in particular on the surface 6 intended to be encapsulated (FIG. 3).

Figure 4:
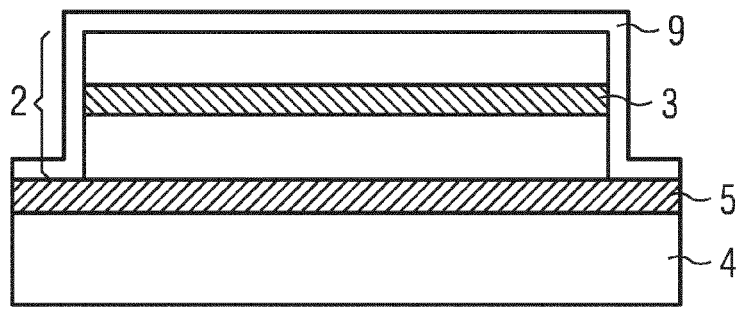

In a further step schematically shown in FIG. 4, a passivation layer 9 is deposited by the help of an ALD-process in direct contact with the surface 6 which is intended to be encapsulated.

The passivation layer 9 comprises, for example, a semiconductor oxide or a metal oxide such as aluminium oxide or silicon oxide. The thickness of the passivation layer 9 lies preferably between 15 nm and 50 nm, including the limits.

Figure 5:
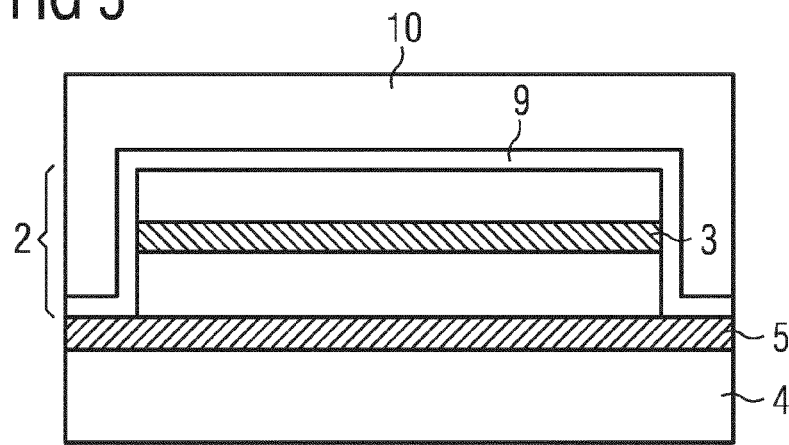

In a further step schematically shown in FIG. 5, a further dielectric layer 10 is deposited in direct contact with the passivation layer 9. The further dielectric layer 10 comprises, for example, a silicon oxide or a silicon nitride.

The dielectric layer 10 can be deposited by one of the following processes: ALD-method, CVD-method, PECVD-method or PVD-method, sputtering.

Our methods and devices are not limited to the description of the examples. Rather, this disclosure comprises each new feature as well as each combination of features, particularly each combination of features of the appended claims, even if the feature or combination of features itself is not explicitly given in the claims or examples.

The invention claimed is:

1. A method of encapsulating an optoelectronic device comprising:
    providing a surface intended to be encapsulated, said surface containing platinum;
    generating reactive oxygen groups and/or reactive hydroxyl groups on said surface containing platinum, wherein the reactive oxygen groups and/or the reactive hydroxyl groups on said surface containing platinum are generated by one of treatment with oxygen containing plasma or treatment with ozone;
    depositing a passivation layer by atomic layer deposition on said surface containing platinum; and
    depositing a further dielectric layer on the passivation layer.

2. The method of claim 1, wherein the passivation layer comprises a metal oxide or a semiconductor oxide.

3. The method of claim 1, wherein the passivation layer comprises one of aluminium oxide or silicon oxide.

4. The method of claim 1, wherein the thickness of the passivation layer is 15 nm to 50 nm.

5. The method of claim 1, wherein the further dielectric layer is deposited by one of atomic layer deposition, chemical vapor deposition, plasma enhanced chemical vapor deposition, physical vapor deposition or sputtering.

6. The method of claim 1, wherein the passivation layer functions as an adhesion enhancing layer with respect to the further dielectric layer.

7. The method of claim 1, wherein the further dielectric layer has a passivating, isolating and/or optical function.

8. The method of claim 1, wherein the further dielectric layer comprises one of silicon oxide or silicon nitride.

9. The method of claim 1, wherein the surface intended to be encapsulated is part of a light-emitting diode chip.

10. A light-emitting diode chip manufactured by the method of claim 1.

11. The light-emitting diode chip of claim 10, which is a thin film light-emitting diode chip.

12. A method of encapsulating an optoelectronic device comprising:
    providing a surface intended to be encapsulated, wherein said surface is partly formed by platinum, another part of the surface is formed by gallium nitride, gallium phosphide or gallium arsenide, and a further part of the surface is formed by silicon oxide,
    generating reactive oxygen groups and/or reactive hydroxyl groups on said surface; and
    depositing a passivation layer by atomic layer deposition on said surface,
    wherein the reactive oxygen groups and/or the reactive hydroxyl groups on said surface are generated by treatment with oxygen containing plasma or treatment with ozone.

13. A method of encapsulating an optoelectronic device comprising:
    providing a thin film semiconductor chip with an epitaxially grown multilayer stack arranged on a carrier, wherein a reflective layer is arranged between the multilayer stack and the carrier, said reflective layer having a surface comprising platinum and the reflective layer projects laterally from the multilayer stack,
    generating reactive oxygen groups and/or reactive hydroxyl groups on side faces of the multilayer stack, on the top face of the multilayer stack and on parts of the surface of the reflective layer projecting laterally from the multilayer stack, and
    depositing a passivation layer with help of atomic layer deposition on the side faces of the multilayer stack, on the front face of the multilayer stack and on the parts of the surface of the reflective layer projecting laterally from the multilayer stack.

* * * * *